United States Patent [19]
Hakozaki

[11] 3,990,014
[45] Nov. 2, 1976

[54] PULSE CONTROL CIRCUIT HAVING MANUALLY VARIABLE OUTPUT PERIOD BETWEEN PULSES

[75] Inventor: Hiroshi Hakozaki, Fuijisawa, Japan

[73] Assignee: Mitsui Shipbuilding and Engineering Co., Ltd., Tokyo, Japan

[22] Filed: Oct. 20, 1975

[21] Appl. No.: 624,237

Related U.S. Application Data
[63] Continuation-in-part of Ser. No. 445,829, Feb. 26, 1974, abandoned.

[30] Foreign Application Priority Data
Feb. 26, 1973  Japan .................................. 48-22778

[52] U.S. Cl. ................................... 328/42; 318/696; 328/44; 328/46; 328/48; 328/49
[51] Int. Cl.² ..................... G05B 19/40; H03K 21/36
[58] Field of Search ................... 328/39, 42, 44, 46, 328/48, 49; 318/696, 685

[56] References Cited
UNITED STATES PATENTS
3,809,990  5/1974  Kuo et al. ........................... 318/696

Primary Examiner—Siegfried H. Grimm
Attorney, Agent, or Firm—Charles W. Helzer

[57] ABSTRACT

The pulse control circuit comprises an up-counter, a pulse generator connected to supply a pulse train having a fixed repetition rate to the up-counter to cause it to count-up to a preset count, a detector connected to the output of the up-counter, a gate circuit responsive to the output of the detector for controlling the input of a preset count to the up-counter, an up-down counter connected to supply the preset count to the up-counter through the gate circuit, a variable pulse generator connected to a count modifying input terminal of the up-down counter for changing the count stored therein, means for storing a preset count in the up-down counter, and means for varying the repetition rate of the output pulses supplied by the variable pulse generator and for controlling the direction in which the up-down counter operates to either add to or substract from a preset count stored in the up-down counter to thereby control the period between the output pulses produced by the pulse control circuit.

9 Claims, 3 Drawing Figures

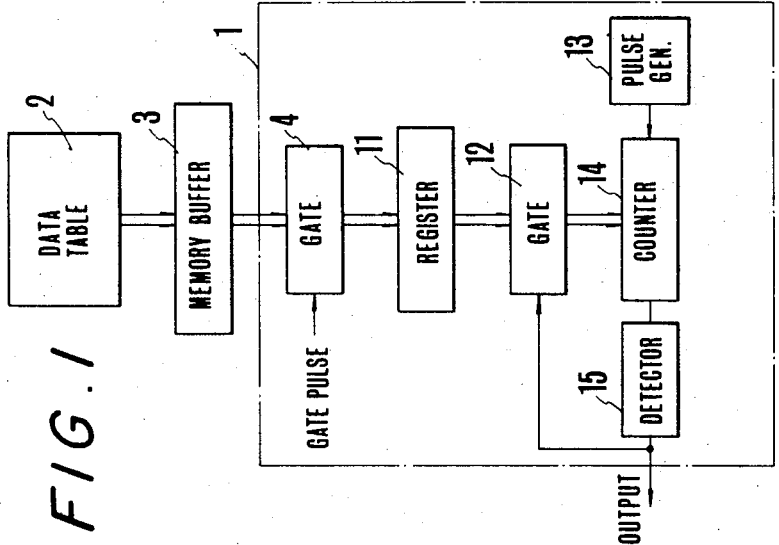

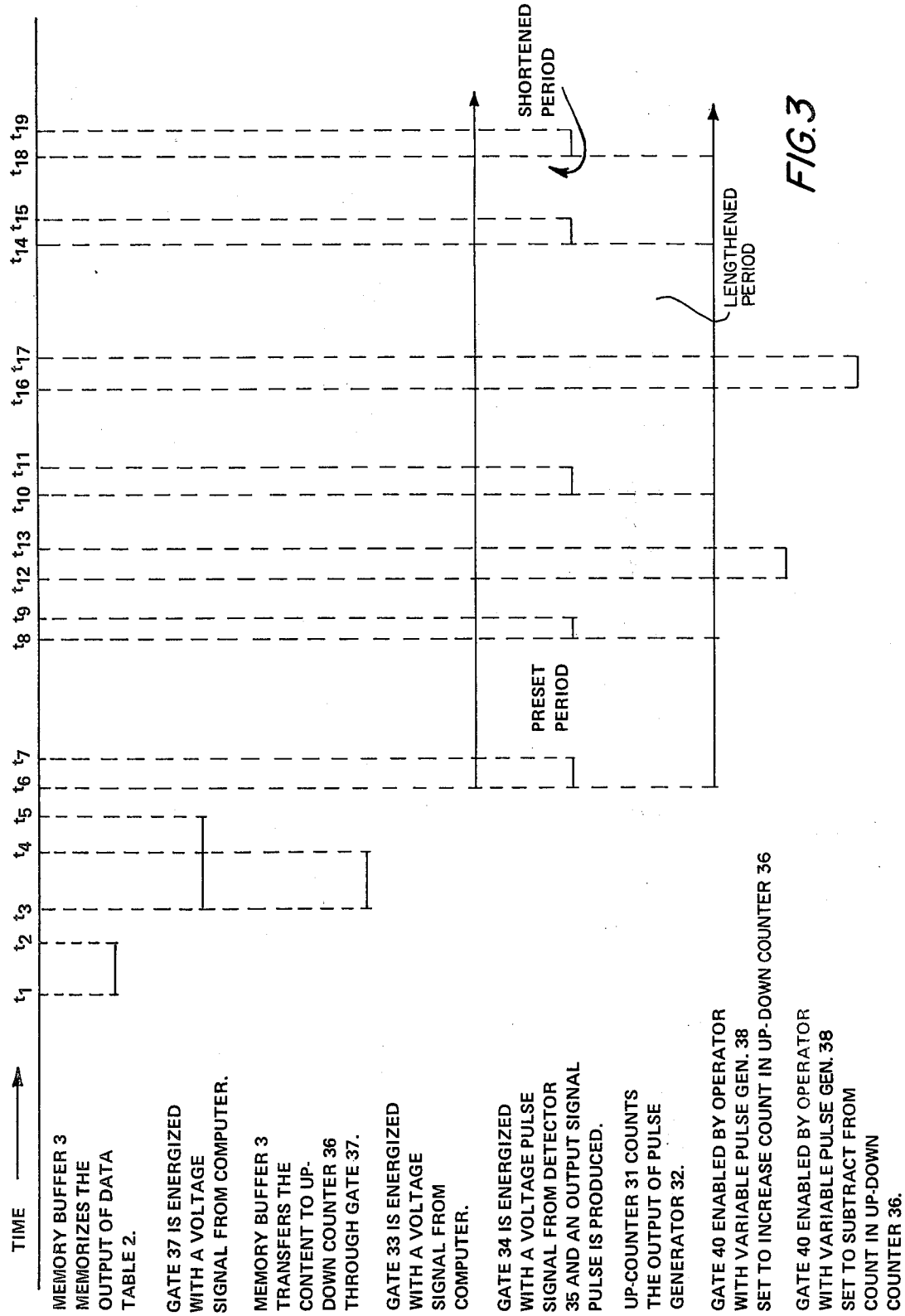

PULSE CONTROL CIRCUIT HAVING MANUALLY VARIABLE OUTPUT PERIOD BETWEEN PULSES

This application is a continuation-in-part of U.S. application Ser. No. 445,829, filed Feb. 26, 1974 and now abandoned.

BACKGROUND OF THE INVENTION

This invention relates to a pulse control circuit and more particularly a pulse control circuit wherein the period between pulses can be varied continuously to drive a load, for example, a stepping motor.

FIG. 1 is a block diagram of one example of a prior art pulse control circuit adapted to drive a stepping motor utilized in an electronic computer. As shown in FIG. 1, the pulse control circuit 1 is comprised by a data table 2 from which information obtained from an electronic computer, not shown, or other source of speed controlling information, is derived. A register 11 is connected to receive a selected speed data signal count derived from data table 2 through a gate circuit 4 associated with a memory buffer circuit 3. An up-counter 14 is preset by the count signal obtained from the register 11 through a gate circuit 12 and is counted up by serially supplied input pulses obtained from a pulse generator 13. A detector 15 is responsive to an overflow output signal from the counter 14 for sending a signal to a stepping motor to be controlled, not shown, and also back to the gate circuit 12.

The pulse control circuit shown in FIG. 1 operates as follows. In response to a command signal from the electronic computer, one of the speed data values stored in the data table 2, is selected and its digital data value temporarily stored in memory buffer circuit 3. Upon application of a gate signal to the gate circuit 4 the value is transferred from memory buffer circuit 3 and stored in the register 11 which resets counter 14 each time gate 12 is activated. The pulses from the pulse generator 13 are applied serially to a second input of the counter 14. Each time the counter overflows, an output pulse signal is produced which is used as the speed control signal for application to the stepping motor (not shown). The output pulse also is fed back and applied to gate circuit 12 for enabling the resetting of counter 14 in accordance with the speed data then stored in register 11. So long as the data stored in the register 11 is not changed, the counter 14 produces a pulse signal having a period corresponding to the speed data count derived from data table 2 and stored in the register 11 and this pulse signal is applied to the stepping motor as the speed data pulse for driving the motor at a speed corresponding thereto.

With this prior art construction, although it is possible to vary the period or repetition rate of the pulses produced by the control circuit 1 in accordance with the speed data stored in the data table 2, the adjustment of the repetition rate must be accomplished by changing the value of the data stored in the data table 2. For this reason, when it is desired to provide a fine speed control or to vary the speed of the stepping motor over a wide range, it is necessary to revise the data stored in the data table 2. To this end, it is necessary not only to provide a special circuit for changing the data stored in the data table but also to change the information of the related circuits controlled by the data table. As has been pointed out hereinabove, the prior art pulse control circuit thus has problems with controlling the speed of the stepping motor finely and covering a wide range. Because of this characteristic, it is difficult to perform a simulation operation wherein it is necessary to continuously regulate the speed of a stepping motor while the operator observes the data which is produced as the stepping motor rotates and is displayed by a display device.

SUMMARY OF THE INVENTION

It is an object of this invention to provide an improved pulse control circuit capable of continuously varying the period (repetition rate) of the output pulse to be supplied to a stepping motor or other device over a wide range.

Briefly stated, the pulse control circuit of this invention comprises an up-counter, a pulse generator connected to supply a pulse of a definite period to one input of the up-counter, a detector connected to the output of the up-counter, a gate circuit connected to the output of the detector for controlling the input of a preset count to the up-counter, an up-down counter connected to supply a preset count to be stored in the up-counter through the gate circuit, a variable pulse generator connected to the up-down counter for changing the value of a count stored therein, means for supplying an input data count to the up-down counter, and means for supplying the output pulses generated by the variable pulse generator to the up-down counter to cause it to count either up or down from the preset count stored therein to thereby control the period (repetition rate) of the output pulses produced by the pulse control circuit.

BRIEF DESCRIPTION OF THE DRAWINGS

In the accompanying drawing;

FIG. 1 is a block diagram showing one example of a prior art pulse control circuit;

FIG. 2 is a block diagram showing a preferred embodiment of the novel pulse control circuit embodying the invention; and FIG. 3 is a timing diagram that illustrates the manner of operation of the novel pulse control circuit shown in FIG. 2.

DESCRIPTION OF THE PREFERRED EMBODIMENTS

In a preferred embodiment of this invention shown in FIG. 2, the same circuit elements as those shown in FIG. 1 are designated by the same reference numerals. Thus, in addition to data table 2 and memory buffer circuit 3, the novel pulse control circuit 50 shown in FIG. 2 further comprises an up-counter 31, an up-down counter 36, a pulse generator 32 connected to apply a pulse of a definite period and fixed repetition rate to a counting input terminal of up-counter 31, a gate circuit 34 for supplying the contents of the up-down counter 36 to the preset count receiving terminals of the up-counter 31 in a parallel fashion, and a detector 35 in the form of a monostable multivibrator connected to the output of the up-counter 31 and back to the input of gate circuit 34.

With the above described arrangement, the up-down counter 36 supplies a preset count to the up-counter 31 via the gate circuit 34 after each output pulse produced by detector 35. A gate circuit 37 is connected between the up-down counter 36 and the memory buffer circuit for supplying a speed data count to up-down counter 36.

Gate 37 is similar in structure and operation to the prior art gate 4 shown in FIG. 1 and controls the application of an input speed data count obtained from data table 2 via memory buffer 3 to up-down counter 36. Gate 37 supplies the speed data count to the up-down counter 36 in a parallel fashion in response to a gate pulse obtained, for instance, from a control computer 42, and is synchronized with the instructions from the computer to select the desired speed data count stored in the data table 2. The manner in which this is achieved will be explained more fully hereinafter in connection with the timing diagram shown in FIG. 3.

A rotary, variable pulse generator 38 is connected to the counting input terminal of up-down counter 36 via a gate circuit 40 for modifying the count stored in up-down counter 36 in a desired manner. The repetition rate of the pulses generated by the rotary, variable pulse generator 38 may be adjusted continuously by rotating a dial knob 39 that controls the variable pulse generator 38 and direction of operation of up-down counter 36. Rotary pulse generator 38 may comprise any conventional, variable frequency pulse generating circuit for producing output pulses having a variable repetition rate. Such circuits generally comprise a variable resistance-capacitance frequency determining network including a variable resistance that is varied to adjust the pulse output frequency of the network by rotating a dial knob such as 39. Accordingly, the word "rotary" as used in describing the rotary, variable pulse generator means that the dial knob 39 is rotated to adjust the (interval) repetition frequency of the output pulses produced by the pulse generator. In addition, dial knob 39 is constructed in such a manner that it has contacts on each side of its center position. When the dial knob 39 is rotated in one direction, for instance, in a clockwise direction, it closes a set of contacts which provide an enabling potential to up-down counter 36 to cause it to add the pulses being supplied from variable pulse generator 38 to the count already preset into it from memory buffer 3. Further rotation of dial knob 39 will change the repetition rate of the pulses supplied from pulse generator 38 to cause it to increase and thereby change the count stored in up-down counter by adding pulses at a faster rate. If dial knob 39 is rotated in a counter-clockwise direction from its central position, it closes a set of contacts which provide an enabling potential to up-down counter 36 and causes it to count down or subtract from the preset count stored therein from memory buffer 3. Further rotation of the dial knob in the counter clockwise rotation causes up-down counter 36 to count down or substract at a faster rate.

Gate circuit 40 is an AND gate and controls the application of the count modifying pulses from variable pulse generator 38 to up-down counter 36 irrespective of the direction, i.e. whether counting-up or down from the preset count read-in from buffer 3. Gate 40 is enabled by closure of a manually actuated switch 41 under the control of an operator of the equipment. For this purpose switch 41 has one of its fixed contacts connected to a direct current source of enabling potential with the remaining movable contact being connected to one of the input terminals to AND gate 40.

Gate 33 is an AND gate and is utilized for the purpose of controlling the supply of fixed repetition rate pulses from pulse generator 32 to the up-counter 31. The control signal applied to the gate 33 may be obtained from the computer or other suitable source. When the control signal is supplied, the gate 33 is enabled so that the up-counter 31 is supplied with pulses to be counted from the pulse generator 32.

The operation of the pulse control circuit 50 comprising the present invention can best be understood in conjunction with the timing diagram illustrated in FIG. 3 of the drawings. Initially, it is assumed that a suitable program has been written for the control computer 42 which will cause the computer to supply the various enabling gating signals to be described hereinafter in conjunction with FIG. 3 at the points in time indicated. In FIG. 3 time is shown to be increasing in the direction from left to right as viewed by a reader. The various levels of signals indicated by their top to bottom positioning in FIG. 3, are merely for convenience of illustration and to facilitate applications of the legend shown near the left-hand margin of FIG. 3.

In addition to the above, it is further assumed that the data table 2, which may comprise a part of the control computer 42, includes a number of different predetermined data counts suitable for operation of the stepping motor or other device (not shown) being controlled by the pulse control circuit 50. After placing the circuit in operation, the operator indicates to the computer a selected data count which then is provided from the data table to the memory buffer 3 during the interval shown in FIG. 3 from time $t_1$ to $t_2$. From time $t_3$ to $t_5$ gate 37 is enabled with a suitable enabling potential supplied from computer 42 and the data count signal stored in memory buffer 3 is transferred to up-down counter 36 through gate 37 from time $t_3$ to $t_4$. At time $t_6$ gate 33 is supplied with an enabling potential from computer 42 and from that point in time until the program in the computer calls for discontinuance of energizing signal pulses to the load being supplied, such as a stepping motor, fixed repetition rate counting pulses will be supplied to the counting input terminal of up-counter 31 through gate 33. If it is assumed that at this point, up-counter 31 has no count stored in it, the first pulse supplied through gate 33 will trigger an output in the detector 35 which will be the first pulse supplied to the load and also will be fed back to open gate 34. Upon this occurrence, indicated during the period of time from $t_6$ to $t_7$, the gate 34 is enabled so that the count then stored in up-down counter 36 is transferred in a parallel manner to up-counter 31. Thereafter, during the period of time from $t_6$ to $t_8$ the up-counter 31 will count the pulses supplied from pulse generator 32 through gate 33 to its counting input terminal. At time $t_8$ counter 31 counts up to the preset count and produces an overflow output signal pulse in detector 35 that is supplied to the stepping motor load and also supplied back to again open gate 34. This results in resetting the count in up-counter 31 to whatever count is then stored in the up-down counter 36. The counting operation is then repeated from the interval of time $t_8$ through $t_{10}$ where another output signal pulse is produced by output detector 35 and again fed back to open gate 34. This operation then is repeated to produce output stepping motor pulses having a repetition rate whose period is represented by the interval of time from $t_6$ to $t_8$, from $t_8$ to $t_{10}$, etc.

If at the interval of time indicated between $t_{12}$ and $t_{13}$, the operator of the equipment desires to perturb the count stored in the up-down counter 36 in a manner to increase the interval of time between output stepping motor pulses (thereby lowering the frequency of the pulses) the switch 41 is closed and rotary knob 39 rotated clockwise to cause up-down counter 36 to be counted up from the preset count stored therein from memory buffer 3. It should be noted that during this interval in the operation of the equipment, up-counter 31 will have already been set to some predetermined count and hence it will overflow and produce an output stepping pulse at the point in time indicated at $t_{10}$ and $t_{11}$. Simultaneously, gate 34 will be opened to read into up-counter the then increased count in up-down counter added during the interval of operation shown at $t_{12}$ to $t_{13}$. The increased count stored in up-counter 31 will then cause a greater interval of time indicated between $t_{10}$ and $t_{14}$ to occur before the production of the next output stepping pulse and reopening of gate 34. If the operator then does nothing further, output stepping motor pulses having a period indicated by the interval between $t_{10}$ and $t_{14}$ will be produced for so long as the program in the computer calls for the production of stepping motor pulses. However, if at some intervening time indicated at $t_{16}$ through $t_{17}$, the operator again closes switch 41, and rotates control knob 39 in a counter-clockwise direction to subtract pulses from the preset count in up-down counter 36, at the end of the period $t_{10}$ through $t_{14}$ when output detector 35 produces another output stepping motor pulse and opens gate 34, the count read into up-counter 31 from up-down counter 36 will be the new lowered count. Lowering of the count results in a shorter interval of time required to fill up counter 31 thereby producing another output stepping motor pulse at the end of the period $t_{18}$ through $t_{19}$. In this manner, the operator of the equipment can modify the preset count read into up-down counter 36 from memory buffer 3 through gate 37 in any desired manner to thereby modify the period and hence repetition rate of the stepping motor output pulses produced at the output of detector 35.

From the foregoing description it will be appreciated that the count signal supplied through gate 37 from buffer memory 3 to the up-down counter 36 is a preset count signal (initial count value) that is predetermined by the data table 2. The signal pulses supplied from variable pulse generator 38 through gate 40 to the up-down counter 36 are used for modifying or changing the initial value of the count read-in from data table 2. Accordingly, the value of the count stored in up-down counter 36 is counted up or down at a rate determined by the frequency and direction of the pulses supplied from variable pulse generator 38 as set by dial knob 39. As a result, the count supplied from the up-down counter 36 to up-counter 31 at the end of each filling of the up-counter 31, is modified in any desired manner by an operator of the equipment as described above, thus modifying the frequency or repetition rate of the output signal pulses supplied to the stepping motor or other device being controlled with the circuit.

While the detector 35 has been described as a monostable multivibrator, any other type of detection circuit could be used.

As has been described above, the invention provides an improved pulse control circuit capable of continuously varying the repetition rate of an output pulse train over a wide range thus controlling the speed of a load as desired. The novel pulse control circuit can be used advantageously for controlling a digital control device or a stepping motor at some preset value as determined by the count set in up-down counter 36 and the value of the count thereafter varied through the medium of rotary pulse generator 38 and gate 40 to optimize the performance of the system.

While the invention has been shown and described in terms of some preferred embodiments, it will be clear that many changes and modifications will occur to those skilled in the art without departing from the spirit and scope of the invention as defined by the appended claims.

What is claimed is:

1. A pulse control circuit for producing pulses having a variable output period comprising an up-counter having first and second inputs and an output, a first pulse generator for generating a pulse train having pulses of a predetermined period, said first pulse generator being connected to serially supply input pulses having a fixed repetition rate to the first input of said up-counter for causing said up-counter to count up to a preset count stored in the up-counter, a detector connected to the output of said up-counter for producing an output signal pulse in response to the serially supplied input pulses accumulating to the preset count stored in the up-counter and the up-counter producing an overflow signal, a gate circuit responsive to the output of said detector and connected to the second input of said up-counter for reading into said up-counter an input speed data count that presets the count stored in said up-counter after each output pulse produced by the detector, an up-down counter having first and second inputs and an output, the output of said up-down counter being connected to supply the input speed data count to the second input of said up-counter through said gate circuit, means for supplying an input data count to the first input of said up-down counter for storing therein said data count, an operator controlled second pulse generator connected to the second input of said up-down counter for serially supplying pulses thereto for changing the count stored in said up-down counter, and means for deriving output signal pulses having an adjustable repetition rate from the output of said detector.

2. The pulse control circuit according to claim 1 wherein said operator controlled second pulse generator includes direction of count controlling means for enabling the up-down counter to count either up or down depending upon the setting of the direction of count controlling means, and said operator controlled second pulse generator is designed to operate at a relatively faster pulse repetition rate than said first pulse generator.

3. The pulse control circuit according to claim 1 which further comprises a data table for storing a plurality of speed data count signals, and a memory buffer connected between said data table and the first input of said up-down counter.

4. A pulse control circuit according to claim 3 wherein the operator controlled second pulse generator is a variable frequency pulse generator for generating pulses having a variable repetition rate for adjustably controlling the rate at which the output adjustable period speed control signal is varied.

5. A pulse control circuit according to claim 4 further including second, third and fourth gate circuits connected respectively to the first input to said up-down counter, intermediate the second pulse generator and the second input of the up-down counter and intermediate the first pulse generator and the first input of said up-counter, said second gate circuit controlling the read-in of input speed data count signals from the memory buffer to the up-down counter, the third gate circuit controlling the application of count modifying pulses supplied from the operator controlled second pulse generator to the second input of the up-down counter, and the fourth gate circuit controlling the application of pulses to be counted from the first pulse generator to the up-counter.

6. A pulse control circuit according to claim 2 further including a data table for storing a plurality of speed data count signals and a memory buffer connected between the data table and the first input of the up-down counter.

7. A pulse control circuit according to claim 6 further including second, third and fourth gate circuits connected respectively, intermediate the memory buffer and the first input to said up-down counter, intermediate the second pulse generator and the second input of the up-down counter and intermediate the first pulse generator and the first input of said up-counter, said second gate circuit controlling the read-in of input speed data count signals to the up-down counter from the memory buffer, the third gate circuit controlling the application of count modifying pulses from the second pulse generator to the second input of the up-down counter, and the fourth gate circuit controlling the application of pulses to be counted from the first pulse generator to the up-counter.

8. A pulse control circuit according to claim 7 wherein the operator controlled second pulse generator is a variable frequency pulse generator for generating pulses having a variable repetition rate for adjustably controlling the rate at which the output adjustable period speed control signal is varied.

9. The pulse control circuit as described in claim 8 wherein said detector comprises a monostable multivibrator.

* * * * *